US010711344B2

(12) United States Patent
Chen et al.

(10) Patent No.: US 10,711,344 B2
(45) Date of Patent: Jul. 14, 2020

(54) PROCESS FOR MAKING COMPOSITE PRODUCT BY PLATING ALLOY FILM ON CARBON FIBER CORE

(71) Applicants: Kuan-Wei Chen, Taipei (TW); Po-Jen Wei, Tainan (TW)

(72) Inventors: Kuan-Wei Chen, Taipei (TW); Po-Jen Wei, Tainan (TW)

(73) Assignee: Taichi Metal Material Technology Co., Ltd., Tainan (TW)

( * ) Notice: Subject to any disclaimer, the term of this patent is extended or adjusted under 35 U.S.C. 154(b) by 393 days.

(21) Appl. No.: 15/690,232

(22) Filed: Aug. 29, 2017

(65) Prior Publication Data

US 2019/0062990 A1 Feb. 28, 2019

(51) Int. Cl.
| | |
|---|---|
| *C23C 14/14* | (2006.01) |
| *C23C 14/18* | (2006.01) |
| *C23C 14/34* | (2006.01) |
| *C23C 14/56* | (2006.01) |
| *C22C 47/04* | (2006.01) |
| *C22C 47/06* | (2006.01) |
| *C22C 49/14* | (2006.01) |
| *D01F 11/12* | (2006.01) |
| *D01F 9/12* | (2006.01) |
| *D06M 10/02* | (2006.01) |
| *D06M 10/06* | (2006.01) |
| *D06M 11/83* | (2006.01) |

(Continued)

(52) U.S. Cl.
CPC ............ *C23C 14/562* (2013.01); *C22C 47/04* (2013.01); *C22C 47/066* (2013.01); *C22C 49/14* (2013.01); *C23C 14/14* (2013.01); *C23C 14/185* (2013.01); *C23C 14/3407* (2013.01); *C23C 14/3464* (2013.01); *D01F 9/12* (2013.01); *D01F 11/127* (2013.01); *D06M 10/02* (2013.01); *D06M 10/025* (2013.01); *D06M 10/06* (2013.01); *D06M 11/83* (2013.01); *D06M 11/84* (2013.01); *C08J 5/042* (2013.01); *C22C 2200/02* (2013.01)

(58) Field of Classification Search
CPC .......... D01F 11/127; D01F 9/12; D01F 11/16; C23C 14/3407; C23C 14/3464; C23C 14/562; C23C 14/185; C23C 14/20; C23C 14/14; D06M 10/02; D06M 10/06; D06M 11/84; D06M 10/025; D06M 11/68; D06M 11/77; D06M 11/83; C22C 49/14; C22C 47/04; C22C 47/066; C08J 5/042
See application file for complete search history.

(56) References Cited

U.S. PATENT DOCUMENTS

| | | | | | |
|---|---|---|---|---|---|
| 4,101,731 | A | * | 7/1978 | Marancik | ................ H01L 39/14 174/125.1 |
| 5,135,554 | A | * | 8/1992 | Rogers, Jr. | ............ C03C 25/107 118/50.1 |

(Continued)

*Primary Examiner* — Michael A Band

(57) ABSTRACT

A process for making a composite product comprises the steps of:
A. Circumferentially plating a carbon fiber core with an alloy film including a film of high entropy alloy and liquid metal alloy or a film of metallic glass to form a film-clad carbon fiber thread;
B. Weaving a plurality of said film-clad carbon fiber threads to form an interlaced film-clad carbon fiber sheet; and
C. Vibrationally thermally pressing a plurality of said interlaced film-clad carbon fiber sheets as superimposed with one another to form a composite product.

2 Claims, 1 Drawing Sheet

(51) Int. Cl.
*D06M 11/84* (2006.01)
*C08J 5/04* (2006.01)

(56) References Cited

U.S. PATENT DOCUMENTS

| | | | | |
|---|---|---|---|---|
| 6,544,357 B1* | 4/2003 | Hehmann | ............... | C23C 14/14 |
| | | | | 148/420 |
| 8,133,358 B2* | 3/2012 | Pavan | ................... | C23C 14/352 |
| | | | | 204/192.12 |
| 2010/0047475 A1* | 2/2010 | Durman | ................. | C23C 14/22 |
| | | | | 427/587 |
| 2010/0051182 A1* | 3/2010 | Graham | ................. | B29C 33/04 |
| | | | | 156/187 |
| 2016/0177434 A1* | 6/2016 | Twigg | ................ | H01J 37/3467 |
| | | | | 204/192.15 |

* cited by examiner

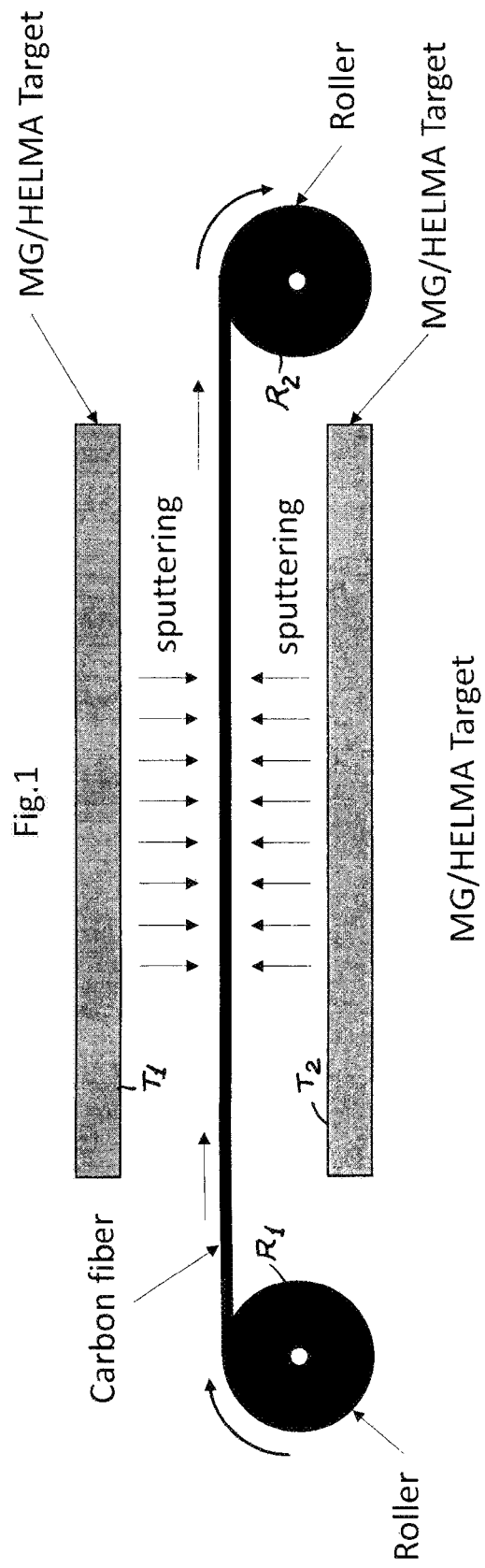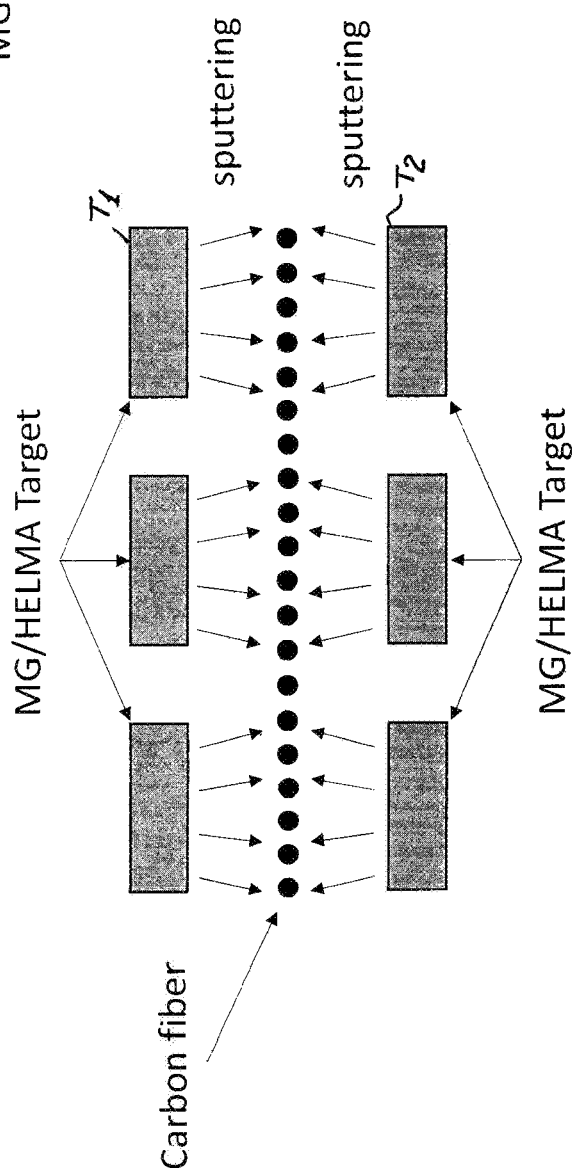
Fig.1
Fig.2

PROCESS FOR MAKING COMPOSITE PRODUCT BY PLATING ALLOY FILM ON CARBON FIBER CORE

BACKGROUND OF THE INVENTION

In recent years, there is a rapid growth of carbon fiber-reinforced composites due to their low density, good strength, and possibility of combining the toughness of thermoplastic polymers with the stiffness and strength of the reinforcing carbon fibers. The epoxy resins as reinforced with carbon fibers have good mechanical properties and have been widely used for producing structural parts of aircraft and many other engineering products.

However, the carbon fiber reinforced epoxy resins have the defects "cavities" existing in the carbon fiber reinforced composites. Such cavities may be caused by the trapping of air pockets in the resin during the production step such as mixing, etc., or during the impregnation of the carbon fiber reinforcement. Macro porosities are majorly present during low viscosity impregnation of the carbon fiber reinforcement while micro pores are caused when the impregnation are conducted in high-viscosity capillary flow. Such porosities or pores may cause a poor interfacial adhesion between the carbon fiber and the epoxy resin, which may then result in "debonding" of carbon fibers from the matrix epoxy resin, thereby making the composite product of carbon fiber reinforced epoxy resin easily brittle or fractured.

SUMMARY OF THE INVENTION

The object of the present invention is to provide a process for making composite product comprising the steps of:

A. Circumferentially plating a carbon fiber core with an alloy film including a film of high entropy alloy and liquid metal alloy or a film of metallic glass to form a film-clad carbon fiber thread;

B. Weaving a plurality of the film-clad carbon fiber threads to form an interlaced film-clad carbon fiber sheet; and C. Vibrationally thermally pressing a plurality of interlaced film-clad carbon fiber sheets as superimposed with one another to form a composite product.

Another object of the present invention is to provide a composite product by plating alloy film on carbon fiber core having high strength, high corrosion resistance, high temperature resistance, with stronger bonding between the carbon fiber core and the alloy film clad on the carbon fiber core for enhancing the strength and prolonging the service life of the composite product.

BRIEF DESCRIPTION OF THE DRAWINGS

FIG. 1 is a flow sheet showing a process for making an alloy film-clad carbon fiber thread in accordance with the present invention.

FIG. 2 is a cross-sectional illustration of FIG. 1.

DETAILED DESCRIPTION

In accordance with the present invention, a film-clad carbon fiber thread is made by plating an alloy film including a film of high entropy alloy and liquid metal alloy (HELMA) or by plating a film of metallic glass (MG) on a carbon fiber core.

The high entropy alloy and liquid metal alloy may be selected from a plurality of metallic elements mixed with a plurality of non-metallic elements, with a general formula as below shown:

Metallic Elements

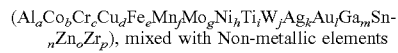, mixed with Non-metallic elements

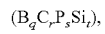, wherein an atomic percentage (%) range for each element is shown as follows:

Al: a=1~50%; Co: b=0~50%; Cr: c=0~50%:
Cu: d=0~70%; Fe: e=0~50%; Mn: f=1~35%;
Mo: g=0~35%; Ni: h=0~50%; Ti: i=0~50%;
W: j=1~35%; Ag: k=0~20%; Au: l=0~30%;
Ga: m=0~10%; Sn: n=0~10%; Zn: o=0~20%;
Zr: p=0~50%; B: q=0~20%; C: r=0~20%;
P: s=0~20%; Si: t=0~20%.

The above formula is a general formula. The elements and atomic percentage thereof are not limited in the present invention. They may be prepared by adjusting a proper proportion of the related elements for the desired product to be made.

The metallic glass may be selected from: Fe-based metallic glass, Ni-based metallic glass, Ti-based metallic glass, Al-based metallic glass, Mg-based metallic glass, Co-based metallic glass, and the other metallic glasses, including multiple-element based metallic glass, not limited in this invention.

The above-mentioned alloys or metallic glasses are formed as a target adapted for the roll-to-roll sputtering process as hereinafter described.

As shown in FIGS. 1 and 2, a roll-to-roll sputtering apparatus is installed. An upper target T1 is mounted on an upper sputter and a lower target T2 is mounted on a lower sputter opposite to the upper sputter. A first roller R1, having carbon fiber cores wound thereon, is provided at a feeding end of the sputtering apparatus. A second roller R2, adapted for taking up the film-clad carbon fiber threads as sputtered in between the upper and lower sputters is provided at the take-up end of the sputtering apparatus.

The carbon fiber core as unwound from the first roller R1, passed through the upper sputter and the lower sputter, will serve as a substrate between the upper target T1 and the lower target T2. The sputtering apparatus is encased in a housing which is formed as a vacuum chamber (not shown).

A strong potential field is formed at each sputter in the sputtering apparatus wherein an inert gas such as argon is fed therein. Argon is ionized in the strong potential field and the argon ions will be accelerated to the targets T1, T2. After impacting against the targets T1, T2, the target atoms (namely, the atoms of high entropy alloy and liquid metal alloy or atoms of metallic glass) are released and travel to the substrate, the carbon fiber core, as passed between the upper and lower targets T1, T2, thereby forming layer or film of atoms around the carbon fiber core. A film-clad carbon fiber thread is thus formed and taken up by the second roller R2.

During the sputtering process, the target atoms are bombarded by the electroplasma of the sputters to become an alloy gas, which is amorphous. After depositing on the carbon fiber core, the alloy gas will be solidified. Since the time is so short, the deposited film is not crystallized and is instantly formed as an amorphous structure. The amorphous film on the carbon fiber core will increase the modulus and flexibility of the sputtered product.

In the sputtering process, the target atoms of high entropy and liquid metal alloys or metallic glasses as coalesced on the substrate, the carbon fiber core, will bind to each other to form a tightly bound atomic layer or film around the carbon fiber core. It means that there is no pore or void between the carbon fiber core and the atomic layer (film) of alloys or metallic glasses. Such a dense interface between the carbon fiber core and the deposited film will preclude air pocket to be entrapped therein, indicating a strong bonding between the film and the core, which will render a better bonding strength for preventing from brittleness or debonding of the outer film and the carbon fiber core, especially being superior to the conventional carbon fiber reinforced epoxy resin composite.

The film-clad carbon fiber thread as wound on the second roller R2 is then further woven to form an interlaced film-clad carbon fiber sheet. Such a carbon fiber sheet may be rolled up to be a bobbin, ready for further processing. The film-clad carbon fiber sheet may also be cut into a desired size, shape or unit.

The film-clad carbon fiber sheet is further processed to be a composite product as below-mentioned:

A vibrational thermal (or hot) pressing apparatus (not shown) is prepared, which may include an upper mold half and a lower mold half, a vibrator or an ultrasonic vibrator mounted to at least one mold half, a heater mounted to at least one mold half, and a lifting means for moving the upper and lower mold halves to be combined together or be separated each other. A vacuum may be formed in the closed pressing apparatus to preclude any air entrapping or contamination.

A plurality of film-clad carbon fiber sheets, as made aforementioned, are stacked or superimposed with one another, and placed in between the two mold halves. Then, the two mold halves are closed to sandwich or clamp the plural carbon fiber sheets between the opposed mold halves.

The heater is started to heat the plural carbon fiber sheets as stacked one another to approach (but less than) a glass transition temperature (Tg) of the high entropy alloy and the liquid metal alloy or the metallic glass.

Then, the ultrasonic vibrator is started to vibrationally oscillate the carbon fiber sheets between the opposed mold halves to increase the temperature of the carbon fiber sheets to be over the glass transition temperature (Tg). The alloys or metallic glasses will be melted instantly due to frictional heat at the elevated temperature (>Tg). Then the vibrator is slopped to stop the vibrations, the temperature will be decreased rapidly to maintain the carbon fiber sheets, as being pressed, at an amorphous state.

The mold halves may be a shaping mold device having mold cavities formed in the mold halves so that the pressed product may be directly formed as a pre-designed shape.

The plurality of carbon fiber sheets are vibrationally thermally pressed to form a composite product, which may be an ingot, a block, a plate, or a work piece.

Such a composite product may be further processed to be a tube, a pipe, a cord, a structural product or an engineering product.

During the vibrational thermal pressing of the present invention, the superimposed film-clad carbon fiber sheets will be heated and vibrationally pressed so as to be dense to preclude any void, pore or air pocket existing in the layers of such carbon fiber sheets.

Accordingly, the pressed composite product composed of the plural carbon fiber sheets will further preclude the cores or voids among the neighboring carbon fiber sheets, to enhance the layer-to-layer (or sheet-to-sheet) bonding between every two neighboring superimposed sheets to increase the bonding strength of the composite product.

So, the present invention has excellent bonding strength (without debonding) due to:
primarily bonding the atomic layer of alloys or metallic glasses with the carbon fiber core to form a strong bonding just at the "first stage", the step when making the film-clad carbon fiber thread; and secondarily bonding the neighboring interlaced film-clad carbon fiber sheets as superimposed with one another from layer to layer (or from sheet to sheet).

In other words, the composite product is formed by stronger bonding from core to core and from sheet to sheet to accomplish a three-dimensional consolidated bonding structure of the composite product.

By the way, the composite product of the present invention has the following enhanced properties, namely, high stiffness, high strength including compression strength, high toughness and flexibility, high corrosion resistance, high temperature durability, and better performance for preventing de-bonding, even with a light-weight structure.

For instance, a high compression strength of the present invention can be obtained as 1000 MPa to 5000 MPa, which is much greater than that of a carbon-fiber reinforced epoxy composite only with 16.8 MPa to 201.3 MPa.

The present invention on may be further modified without departing from the spirit and scope of the present invention.

We claim:

1. A process for making a composite product comprising steps of:
    A. Circumferentially plating a carbon fiber core with an alloy film including a film of metallic glass to form a film-clad carbon fiber thread; wherein a first film of said metallic glass is formed as an upper target and a second film of said metallic glass is formed as a lower target, adapted for a roll-to-roll sputtering process for plating said first and second films of metallic glass on said carbon fiber core; and
    said roll-to-roll sputtering process performed by a roll-to-roll sputtering apparatus, which includes: said upper target mounted on an upper portion of said roll-to-roll sputtering apparatus and said lower target mounted on a lower portion of said roll-to-roll sputtering apparatus opposite to the upper portion; a first roller having said carbon fiber core wound thereon and provided at a feeding end of said roll-to-roll sputtering apparatus; and a second roller, adapted for taking up one said film-clad carbon fiber thread as sputtered in between said upper portion and said lower portion of said roll-to-roll sputtering apparatus and provided at a take-up end of said roll-to-roll sputtering apparatus; and wherein said carbon fiber core, as unwound from said first roller and passed through said upper portion and said lower portion of said roll-to roll sputtering apparatus, serves as a substrate between said upper target and said lower target in said roll-to-roll sputtering apparatus, which is encased in a housing formed as a vacuum chamber;
    B. Weaving a plurality of said film-clad carbon fiber threads to form an interlaced film-clad carbon fiber sheet; and
    C. Vibrationally thermally pressing a plurality of interlaced film-clad carbon fiber sheets as superimposed with one another by a vibrational thermal pressing apparatus, which includes an upper mold half and a lower mold half combinally closed for clamping said film-clad carbon fiber sheets therebetween, a vibrator mounted to said upper mold half or said lower mold half, a heater mounted to said upper mold half or said lower mold half, and a lifting device for moving the upper mold half and the lower mold half to be combined together or to be separated from each other to form the composite product.

2. A process according to claim 1, wherein said metallic glass is selected from: Fe-based metallic glass, Ni-based metallic glass, Ti-based metallic glass, Al-based metallic glass, Mg-based metallic glass, and Co-based metallic glass.

* * * * *